United States Patent
Mikan, Jr.

(10) Patent No.: US 8,502,564 B2
(45) Date of Patent: Aug. 6, 2013

(54) ADJUSTABLE SCHMITT TRIGGER

(75) Inventor: Donald G. Mikan, Jr., Austin, TX (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 186 days.

(21) Appl. No.: 13/192,690

(22) Filed: Jul. 28, 2011

(65) Prior Publication Data

US 2013/0027085 A1  Jan. 31, 2013

(51) Int. Cl.
*H03K 19/20* (2006.01)
*H03K 19/094* (2006.01)

(52) U.S. Cl.
USPC .......................................... 326/119; 326/104

(58) Field of Classification Search
None
See application file for complete search history.

(56) References Cited

U.S. PATENT DOCUMENTS

| | | | | |
|---|---|---|---|---|
| 5,986,463 | A | * | 11/1999 | Takiguchi ........................ 326/27 |
| 6,420,907 | B1 | * | 7/2002 | Sutherland et al. ............ 326/121 |
| 7,068,063 | B2 | * | 6/2006 | Seike ............................... 326/27 |
| 7,982,505 | B2 | * | 7/2011 | Takeda ........................... 326/105 |

* cited by examiner

*Primary Examiner* — Crystal L Hammond
(74) *Attorney, Agent, or Firm* — Lowe Hauptman Ham & Berner, LLP

(57) ABSTRACT

A circuit comprises an inverter, a first transistor, a second transistor, and at least one switching circuit. The inverter has a first node and a second node. The first transistor has a first terminal, a second terminal, and a third terminal. The second transistor has a fourth terminal, a fifth terminal, and a sixth terminal. The at least one switching circuit is configured to switch a connection of at least one of the first transistor and the second transistor to the inverter. The second terminal and the fifth terminal are coupled to the first node. The third terminal and the sixth terminal are coupled to the second node. The first transistor and the second transistor are configured to cause a plurality of time delays at the second node.

20 Claims, 8 Drawing Sheets

ADJUSTABLE SCHMITT TRIGGER

FIELD

The present disclosure is related to an adjustable Schmitt trigger.

BACKGROUND

Currently, there are many known methods used to introduce controllable delays in a circuit path. For example, in an approach, additional delays are added by adding additional logic gates to an input-output path of the circuit. The signal traveling from the input through each logic gate to the output is delayed by the logic gates as each logic gate includes an amount of time delay. Adding logic gates, however, adds complexities and costs to the circuit. In another approach, a transistor coupled to a capacitor serves as a capacitive load to slow down the signal transition or, effectively, delay the signal. This approach requires costly die area to generate the appropriate capacitance value. Different mechanisms to control the delay are needed.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
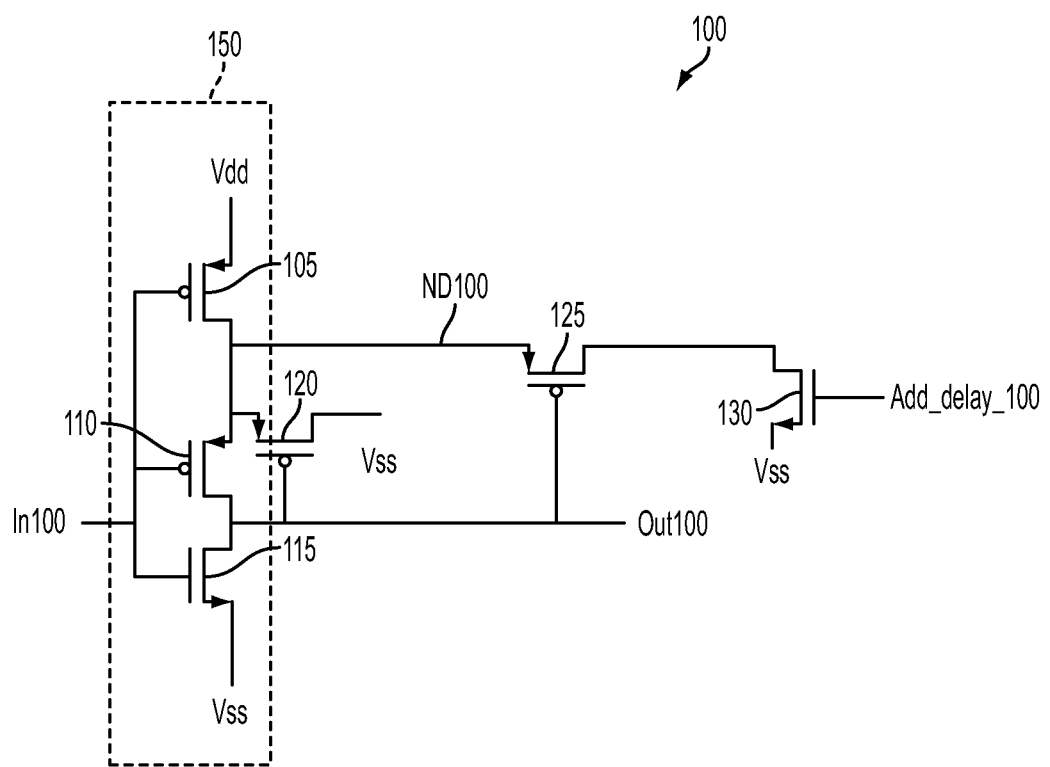
FIG. 1 is a diagram of a part of an adjustable Schmitt trigger circuit, in accordance with an embodiment.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. A delay is controllable through a Schmitt trigger. In some embodiments, a small transistor count is used to vary the trip point of an inverter. A delay in a delay chain is faster compared with an existing approach. The feedback strength of the Schmitt trigger is programmed to adjust the delay. Adjusting the full gate delay is not used.

Exemplary Circuit, an Embodiment

FIG. 1 is a diagram of a circuit 100, in accordance with some embodiments. Inverter 150 and PMOS transistor 120 are part of a Schmitt trigger circuit known to the applicant.

Inverter 150 includes PMOS transistor 105, PMOS transistor 110, and NMOS transistor 115. When input In100 at the gates of NMOS transistor 115, PMOS transistor 110, and PMOS transistor 105 is applied with a low logic level (Low), NMOS transistor 115 is turned off, and acts as an open circuit. PMOS transistors 105 and 110, however, are turned on. As a result, output Out100 receives voltage Vdd at the source of PMOS transistor 105 as a high logic level (High). In contrast, when input In100 is High, PMOS transistors 105 and 110 are turned off, and act as an open circuit. NMOS transistor 115, on the other hand, is turned on. As a result, output Out100 is pulled to reference voltage Vss at the source of NMOS transistor 115. Effectively, output Out100 is Low.

For illustration, voltage Vout100 (not labeled) is the voltage at output Out100. Voltage Vnd (not labeled) is the voltage at node ND100 or at the source of transistor 125. Voltage Vnd is also the voltage at the drain of PMOS transistor 105 and at the source of PMOS transistor 120. Voltage Vgs120 (not labeled) is the voltage dropped across the gate and the source of transistor 120. As a result, Vgs120=Vout −Vnd. Voltage Vtp120 is the threshold voltage of PMOS transistor 120. As a result, when |Vgs120| is less than |Vtp120|, transistor 120 is turned off. But when |Vgs120| is higher than |Vtp120|, transistor 120 is turned on.

PMOS transistor 120 is used to control the transition of output Out100 or to control the delay of output Out100 with respect to input In100. Transistor 120 is called a feedback transistor of the Schmitt trigger. When transistor 120 is turned off, transistor 120 acts as an open circuit, and has no electrical effect on inverter 150. In some embodiments, when transistor 120 is turned on, transistor 120 tends to pull node ND100 at the source of transistor 120 to voltage Vss at the drain of transistor 120. In other words, transistor 120 tends to keep node ND100 at a Low longer when node ND100 is transitioning from a Low to a High. As a result, when input In100 transitions from a High to a Low, transistor 120 makes it more difficult for output Out100 to transition from a Low to a High because node ND100 stays at a Low longer than the situation in which transistor 120 is not electrically coupled to inverter 150. Explained in another way, inverter 150 takes longer to invert input data at input In100 to output data at output Out100. Effectively, the input trip point Trp150 (not labeled) of inverter 150 has been lowered when input In100 is transitioning from a High to a Low. When voltage Vout100 at output Out100 rises high enough such that |Vgs120| is lower than |Vtp120|, transistor 120 is turned off and has no electrical effect on inverter 150.

For illustration, the input trip point of inverter 150 is called trip point Trp150. The amount of change of trip point Trp150 of inverter 150 depends on the driving capability of transistor 120, which, in turn, depends on the size of transistor 120. For example, the bigger the transistor 120, the stronger the driving capability of transistor 120 is. As a result, the lower the input trip point Trp150 or the larger the change in trip point Trp150 is. In contrast, the smaller the transistor 120, the weaker the driving capability of transistor 120 is. As a result, the higher the trip point Trp150, or the smaller the change in trip point Trp150.

NMOS transistor 130 functions as a switch to electrically connect transistor 125 to inverter 150. For example, when signal Add_delay_100 at the gate of NMOS transistor 130 is applied with a Low, transistor 130 is turned off, and acts as an open circuit. Transistor 125 is therefore electrically disconnected from inverter 150, and has no electrical effect on inverter 150. On the other hand, when signal Add_delay_100 is applied with a High, transistor 125 is turned on. Transistor 125 is thus electrically connected to inverter 150 as the current of transistor 125 flows through transistor 130. Transistor 130 is used for illustration, different types of switching circuits and/or different configurations of the transistors and/or switching circuits used to electrically connect and disconnect transistor 125 from inverter 150 are within the scope of various embodiments.

Transistor 125, when being on, functions in a similar manner as transistor 120 with respect to the transition of output Out100. For example, when transistor 125 is turned on, transistor 125 tends to pull node ND100 at the source of transistor 125 to voltage Vss or a Low at the drain of transistor 130. In other words, transistor 125 makes it more difficult for output Out100 to switch from a Low to a High. Effectively, transistor 125 causes additional delay to output Out100 when output Out100 transitions from a Low to a High. Transistor 125 also lowers trip point Trp150 of inverter 150.

Similar to transistor 120 with respect to trip point Trp150, the amount of change of trip point Trp150 of inverter 150 depends on the driving capability of transistor 125, which in turn depends on the size of transistor 125. For example, the larger the transistor 125, the stronger the driving capability of transistor 125 is. As a result, a larger transistor lowers the input trip point Trp150, and increases the change of trip point Trp150. In contrast, the smaller the transistor 125, the weaker the driving capability of transistor 125 is. As a result, a smaller transistor raises the input trip point Trp150, and reduces the amount of change of trip point Trp150.

In some embodiments, one or a combination of the driving capabilities of transistor 120, transistor 125, and transistor 130 is selected to achieve a predetermined delay on output Out100 and/or a predetermined change in trip point Trp150. For example, a predetermined delay is selected. A combination of the sizes of transistor 120, transistor 125, and transistor 130 is determined for the predetermined delay to be achieved. Similarly, a predetermined change in trip point Trp150 is determined. One or a combination of the corresponding sizes of transistor 120, transistor 125, and transistor 130 is determined for the predetermined change in trip point Trp150 to be achieved.

In some embodiments, transistor 125 is turned on so that output Out100 is delayed or switches slowly from a Low to a High. But when output Out100 is to switch faster, transistor 125 is turned off so that there is no delay effect of transistor 125 to output Out100.

In FIG. 1, one pair of transistors 125 and 130 is shown for illustration. One or a plurality of additional pairs of transistors 125 and 130 may be coupled in parallel with transistors 125 and 130 to add additional delays to output Out100.

In some embodiments, transistors 120 and 125 have the same threshold voltage values so that when transistors 120 and 125 are on, transistors 120 and 125 are each turned off at the same time. Transistors 120 and 125 having different threshold voltage values are within the scope of various embodiments.

Another Exemplary Embodiment

Figure 2:
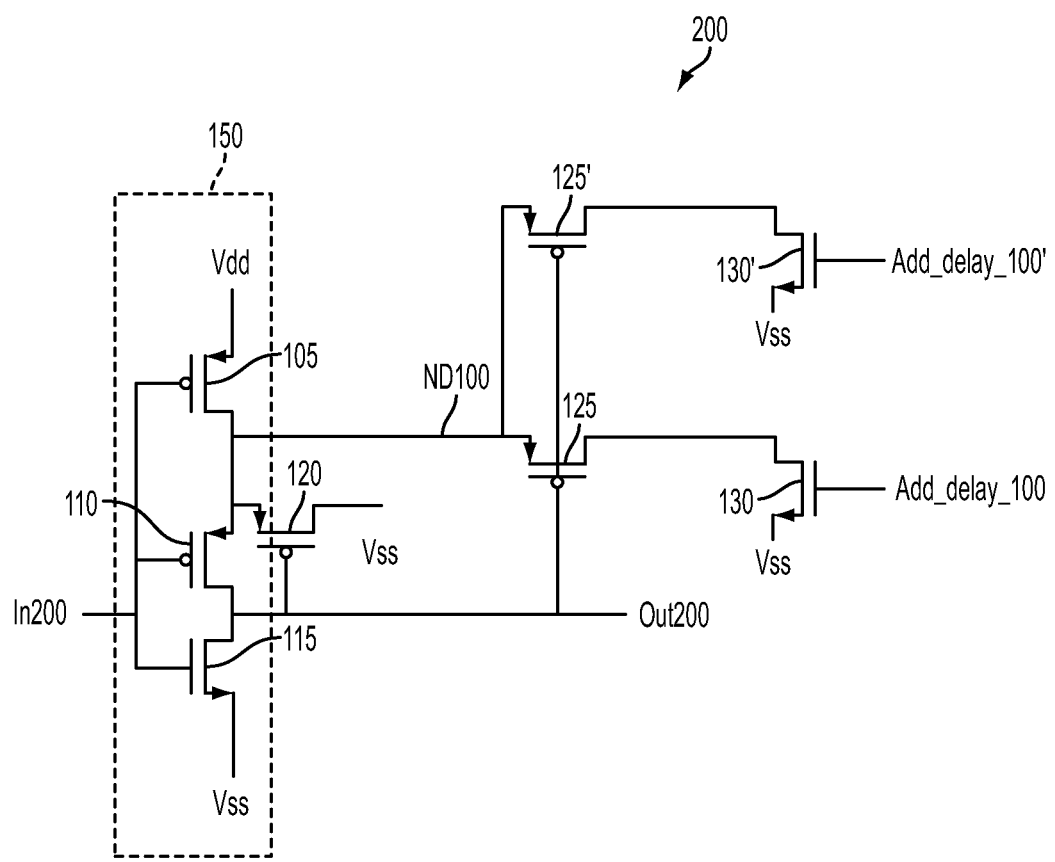
FIG. 2 is a diagram of a part of an adjustable Schmitt trigger circuit, in accordance with another embodiment.

FIG. 2 is a diagram of a circuit 200, in accordance with some embodiments. Compared with circuit 100, circuit 200 includes an additional pair of transistors transistor 125' and transistor 130'. The source of transistor 125' is coupled to the source of transistor 125 while the drain of transistor 125' is coupled to the drain of transistor 130'. The gate of transistor 125' is coupled to the gate of transistor 125. The source of transistor 130' receives voltage Vss, and the gate of transistor 130' receives signal Add_delay_100'. Signal Add_delay_100' and transistor 130' are used to switch transistor 125' in a similar manner as signal Add_delay_100 and transistor 130 being used to switch transistor 125.

Together with transistor 120, different numbers of transistors 125 and 125' are electrically connected to inverter 150 at a time to generate the predetermined delay and/or to result in the predetermined change in trip point Trp150. Different sizes for different transistors 125 and 125' are within the scope of various embodiments. In some embodiments, the predetermined delay, the amount of change in trip point Trp150, the sizes of transistors 120, 125, and 125' are achieved by simulation.

Various embodiments are advantageous because the sizes of transistors 120, 125, and 125' vary. For example, different combinations of each size of transistor 120, of transistor 125, and of transistor 125' may be used for a particular predetermined delay or a particular predetermined change in trip point Trp150. As a result, circuits 100 and 200 are called adjustable or programmable Schmitt trigger inverters.

In FIGS. 1 and 2, a switching circuit can be used to electrically switch transistor 120 from and to inverter 150 to change the delay at node ND100. For example, a transistor is used to switch transistor 120 in the same manner as a transistor 130 being used to switch a transistor 125. Other switching mechanisms are within the scope of various embodiments.

Another Exemplary Embodiment

Figure 3:
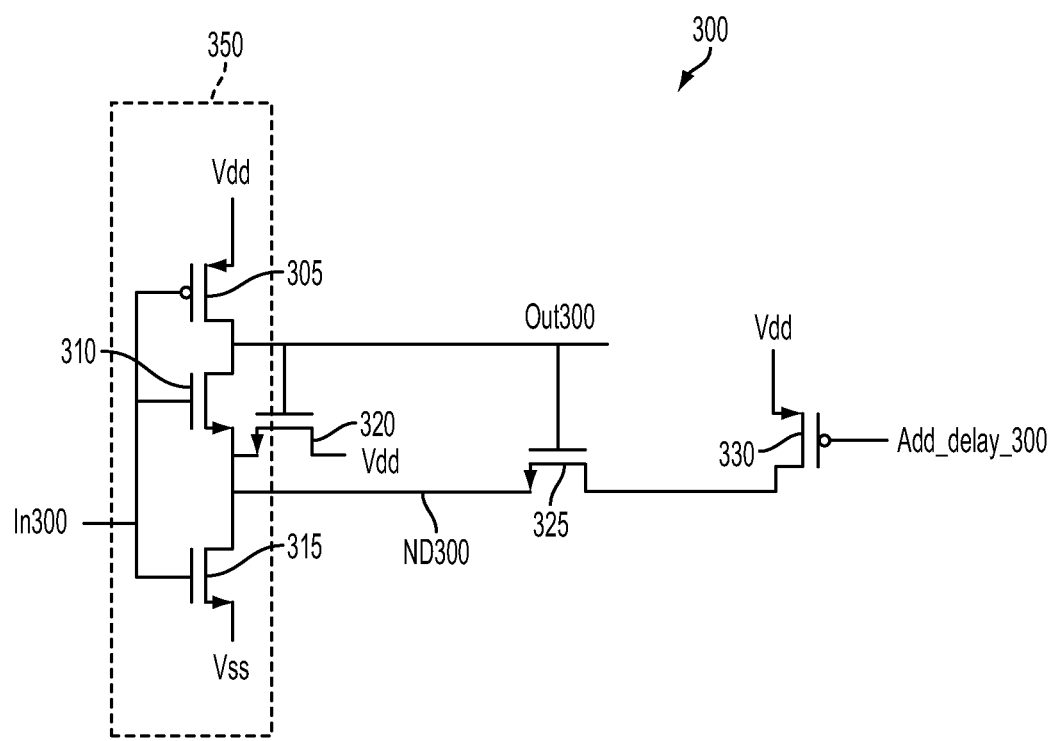
FIG. 3 is a diagram of a part of an adjustable Schmitt trigger circuit, in accordance with another embodiment.

FIG. 3 is a diagram of a circuit 300, in accordance with some embodiments. In circuit 100 of FIG. 1, output Out100 of circuit 100 is delayed when output Out100 transitions from a Low to a High. In contrast, output Out300 of circuit 300 is delayed when output Out300 transitions from a High to a Low.

Inverter 350 includes PMOS transistor 305, NMOS transistor 310, and NMOS transistor 315. The operation of each transistor 305, 310, and 315 with respect to inverter 350 is not described, but should be recognizable by persons of ordinary skill in the art.

Transistors 320, 325, and 330 correspond to transistor 120, 125, and 130 in circuit 100, respectively. Transistors 120 and 125 in circuit 100 add a delay to output Out100 when output Out100 transitions from a Low to a High. Transistors 320 and 325, however, add a delay to output Out300 when output Out300 transitions from a High to a Low. For example, when transistor 330 is turned on, the drain of NMOS transistor 325 receives voltage Vdd at the source of PMOS transistor 330. As a result, transistor 325 tends to keep node ND300 at the source of transistor 325 or the source of NMOS transistor 310 at the high voltage level of voltage Vdd at the drain of transistor 325. As a result, node ND300 and thus output Out300 is kept at a High longer than the situation in which transistor 325 is electrically disconnected from inverter 350.

Effectively, output Out300 is delayed when output Out300 transitions from a High to a Low. Stated differently, the trip point Trp350 (not labeled) of inverter 350 is raised when input In300 transitions from a Low to a High.

Transistor 330 and signal Add_delay_300 are used to switch transistor 325 to inverter 350 in the same manner as transistor 230 and signal Add_delay_100 in circuit 100 are being used to switch transistor 225 to inverter 150 in circuit 100.

A pair of transistors 325 and 330 is shown in FIG. 3 for illustration. Additional pairs of transistors 325 and 330 added to circuit 300 to cause different delays for output Out300 are within the scope of various embodiments. Different sizes of transistors 320 and 325 to cause different amount of delays for output Out300 and different trip point Trp350 are within the scope of various embodiments.

Another Exemplary Embodiment

Figure 4:
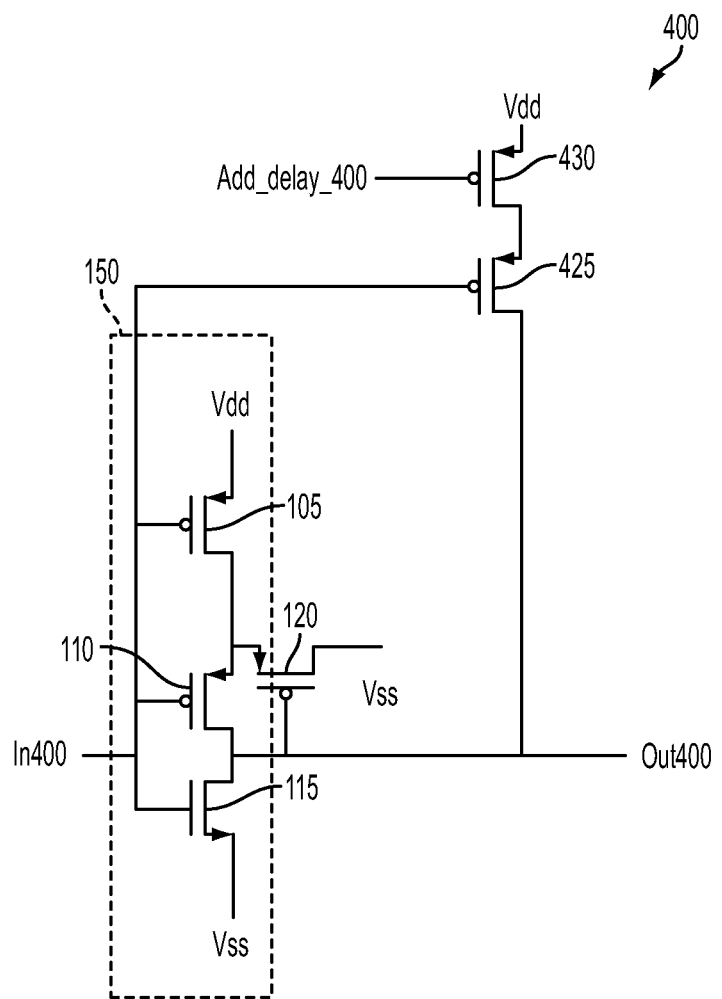
FIG. 4 is a diagram of a part of an adjustable Schmitt trigger circuit, in accordance with another embodiment.

FIG. 4 is a diagram of a circuit 400, in accordance with some embodiments. Compared with circuit 100, circuit 400 does not include transistors 125 and 130. Circuit 400, however, includes PMOS transistors 425 and 430 corresponding to transistors 125 and 130 in circuit 100, respectively. Transistors 425 and 430, however, are configured differently.

Transistor 430 together with signal Add_delay_400 functions as a switch that electrically connects transistor 425 to inverter 150. For example, when signal Add_delay_400 is applied with a High, transistor 430 is turned off, and transistor 425 is electrically disconnected from inverter 150. On the other hand, when signal Add_delay_400 is applied with a Low, transistor 430 is turned on. As a result, the source of transistor 425 receives voltage VDD at the source of transistor 430, and operates in conjunction with the operation of inverter 150. In other words, transistor 425 is electrically connected to inverter 150.

The gate of transistor 425 receives input In400. As a result, transistor 425 is turned on and off by the logic level of input In400. In some embodiments, transistor 425 is designed such that when input In400 is transitioning from a High to a Low, transistor 425 is turned on before input In400 reaches trip point Trp150 of inverter 150. In other words, transistor 425 is turned on before output Out400 switches from a Low to a High. For example, when input In400 is initially High, transistor 425 is turned off. Input In400 then transitions from a High to a Low. As soon as input In400 reaches a voltage value low enough for transistor 425 to be turned on, transistor 425 is turned on. Input In400 then continues to fall low to reach trip point Trp150 for output Out400 to switch from a Low to a High. Because by the time output Out400 is switching from a Low to a High, PMOS transistor 425 has been turned on, PMOS transistor 425 causes output Out to rise faster. In other words, transistor 425 reduces the delay of output Out400.

In some embodiments, signal Add_delay_400 is applied with a High so that transistor 430 is turned off and output Out400 is delayed. When it is determined that the delay of output Out400 is to be reduced, signal Add_delay_400 is applied with a Low so that transistor 430 is turned on to cause output Out400 to rise faster or, in other words, to cause delay on output Out400 to be reduced.

In some embodiments, transistor 120 and transistor 425 are sized to achieve a predetermined delay time and a predetermined change in trip point Trp150. Further, one or a plurality of pair of transistors 425 and 430 is added to achieve different amounts of delays.

Another Exemplary Embodiment

Figure 5:
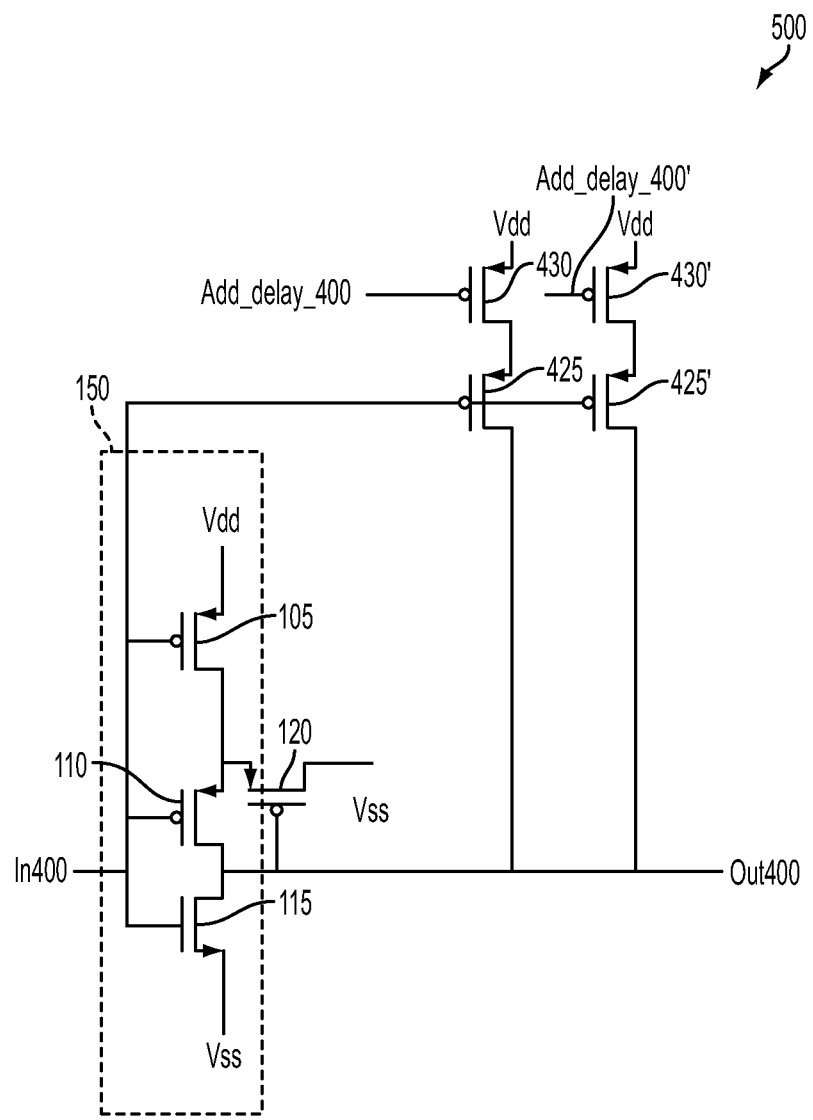
FIG. 5 is a diagram of a part of an adjustable Schmitt trigger circuit, in accordance with another embodiment.

FIG. 5 is a diagram of a circuit 500, in accordance with some embodiments. Compared with circuit 400, circuit 500 additionally includes transistor 425' and 430'. Transistor 425' causes a delay on output Out400 and a change in trip point Trp150 in a manner similar as transistor 425 causing a delay on output Out400 and a change in trip point Trp150. Transistor 430' and signal Add_delay_400' are used to switch transistor 425' to inverter 150 in the same manner as transistor 430 and signal Add_delay_400 are being used to switch transistor 425 to inverter 150. A pair of transistors 425' and 430' is shown for illustration. Additional pairs of transistors 425' and 430' added to circuit 500 to cause different delays on output Out400 and different changes in trip point Trp150 are within the scope of various embodiments.

Another Exemplary Embodiment

Figure 6:
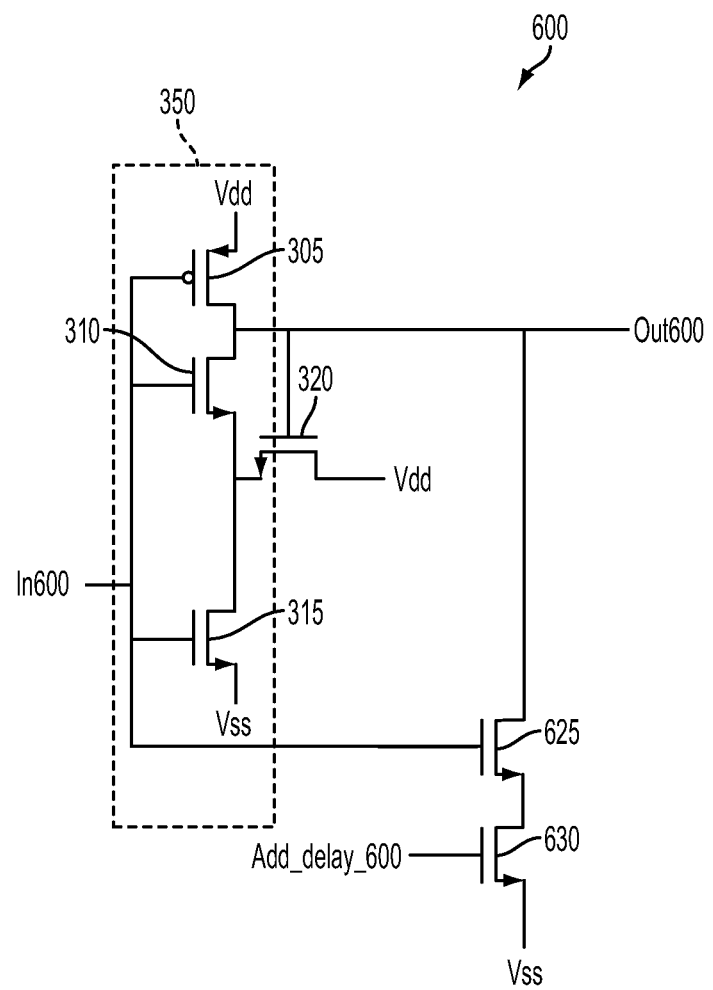
FIG. 6 is a diagram of a part of an adjustable Schmitt trigger circuit, in accordance with another embodiment.

FIG. 6 is a diagram of a circuit 600, in accordance with some embodiments. In circuit 400, output Out400 is pulled up faster when output Out400 transitions from a Low to a High. In contrast, in circuit 600, output Out600 is pulled down faster when output Out600 transition from a High to a Low.

Transistor 630 functions as a switch to electrically connect transistor 625 to inverter 350. For example, when signal Add_delay_600 is applied with a Low, transistor 630 is turned off, and transistor 625 is electrically disconnected from inverter 350. On the other hand, when signal Add_delay_600 is applied with a High, transistor 630 is turned on. As a result, the source of transistor 625 receives voltage Vss at the source of transistor 630, and operates in conjunction with the operation of inverter 350. In other words, transistor 625 is electrically connected to inverter 350.

The gate of transistor 625 receives input In600. As a result, transistor 625 is turned on and off by the logic level of input In600. In some embodiments, transistor 625 is designed such that when input In600 is transitioning from a Low to a High, transistor 625 is turned on before input In600 reaches trip point Trp350 (not labeled) of inverter 350. In other words, transistor 625 is turned on before output Out600 switches from a High to a Low. For example, when input In600 is initially Low, transistor 625 is turned off. Input In600 then transitions from a Low to a High. As soon as input In600 is High enough for transistor 625 to be turned on, transistor 625 is turned on. Input In600 then continues to rise to reach trip point Trp350 for output Out600 to switch from a High to a Low. Because by the time output Out600 is switching from a High to a Low, NMOS transistor 625 has been turned on, NMOS transistor 625 causes output Out600 to fall faster. In other words, transistor 625 reduces the delay of output Out600 when output Out600 transitions from a High to a Low.

A pair of transistors 625 and 630 shown in FIG. 6 is for illustration. One or a plurality of pairs of transistors 625 and 630 added to circuit 600 to cause different delays on output Out600 and different changes in trip point Trp350 are within the scope of various embodiments.

Exemplary Methods

Figure 7:
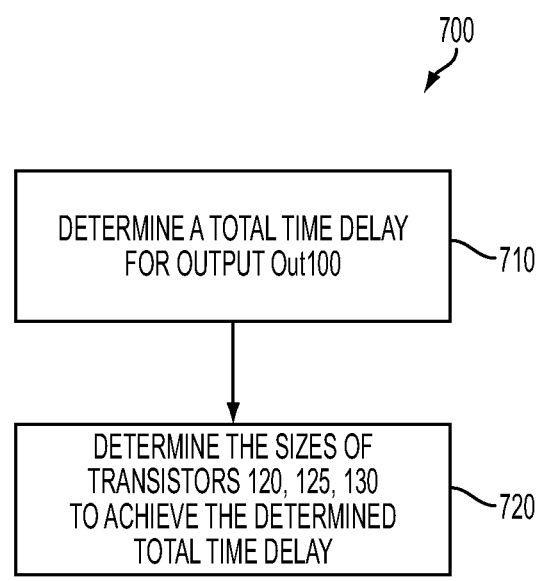
FIG. 7 is a flowchart of a method illustrating how the circuit in FIG. 1 is configured, in accordance with some embodiments.

FIG. 7 is a flow chart of a method 700 illustrating how circuit 100 is configured.

In step 710, a total time delay to be caused by transistors 120 and 125 is determined. Alternatively, a change in trip point Trp150 of inverter 150 is determined.

In step 720, the combination of the sizes of transistors 120, 125, and 130 are determined to achieve the predetermined time delay and/or the predetermined change in trip point Trp150. In some embodiments, the size of transistor 120 is selected, then the size of transistor 125 and/or 130 is selected.

Figure 8:
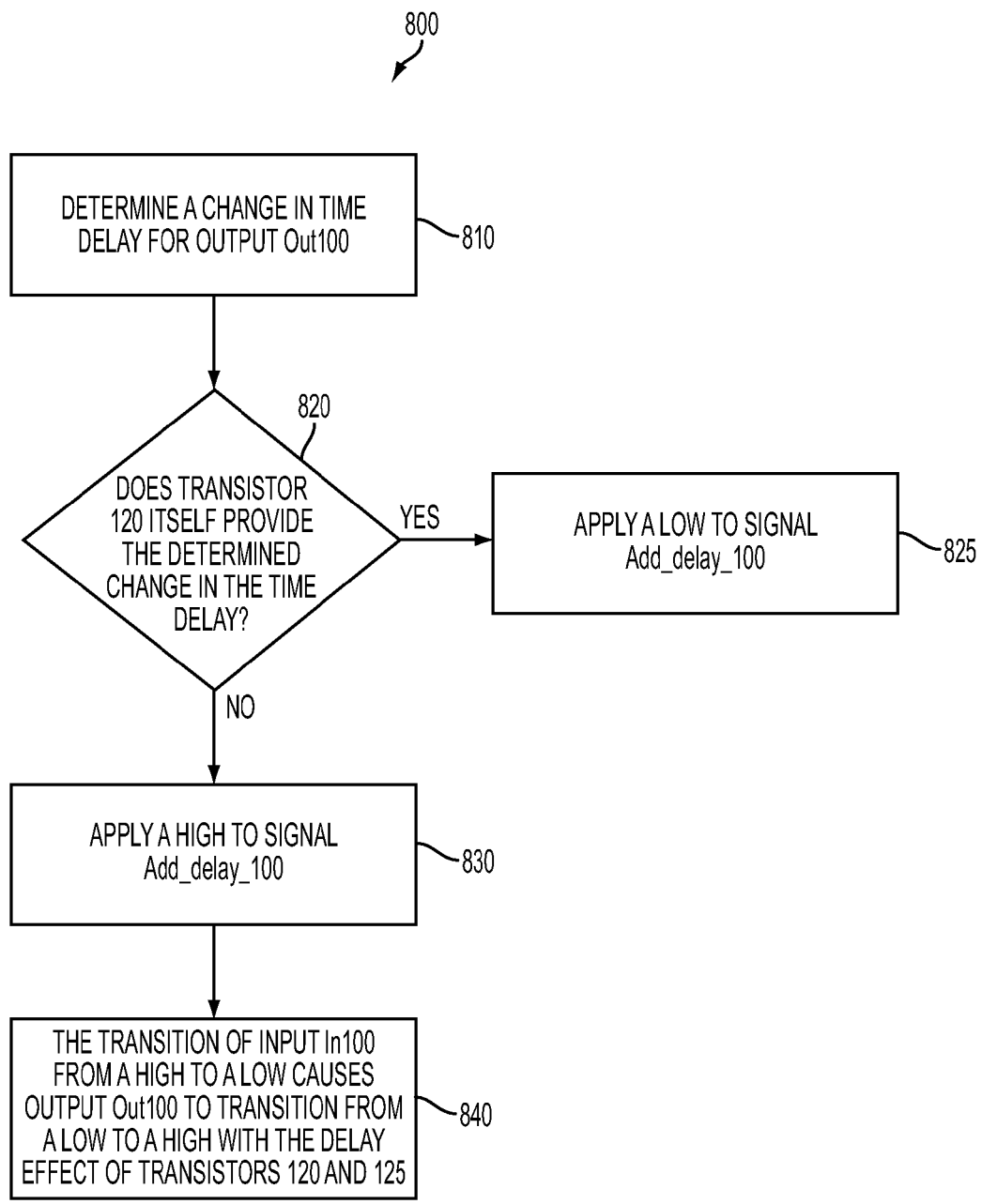
FIG. 8 is a flowchart of a method illustrating an operation of the circuit in FIG. 1, in accordance with some embodiments.

FIG. 8 is a flow chart of a method 800, illustrating an operation of circuit 100, in accordance with some embodiments. For illustration, circuit 100 has been configured as illustratively explained in FIG. 7. Further, input In100 transitions from a High to a Low. As a result, output Out100 transitions from a Low to a High. Based on this illustration, input In100 and output Out100 are initially High and Low, respectively.

In step 810, a change in a time delay for output Out100 is determined.

In step 820, it is determined whether transistor 120 provides the time delay determined in step 810. If transistor 120 provides the predetermined time delay in step 810, then, in step 825, signal Add_delay_100 is applied with a Low to turn off transistor 125 (i.e., to electrically disconnect transistor 125 from inverter 150).

For illustration, transistor 120 does not provide the time delay determined in step 810. As a result, signal Add_delay_100 is applied with a High in step 830 to electrically connect transistor 125 to inverter 150.

In step 840, when input In100 transitions from a High to a Low, output Out100 transitions from a Low to a High. The transition from the Low to the High of output Out100, however, is delayed by the effect of transistors 120 and 125.

In step 850, when output Out100 rises to a voltage level high enough for transistor 120 and/or 125 to be turned off, transistor 120 and/or 125 is turned off.

FIGS. 7 and 8 related to circuit 100 are used for illustration. The configuration and operation of circuits 200-600 should be recognizable by persons of ordinary skill in the art after reviewing the illustrated methods in FIGS. 7 and 8 and the materials disclosed in this document.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration. Embodiments of the disclosure are not limited to a particular type. Selecting different dopant types for a particular transistor is within the scope of various embodiments. The low or high logic level (e.g., Low or High) of the various signals used in the above description is also for illustration. Various embodiments are not limited to a particular level when a signal is activated and/or deactivated. Selecting different levels is within the scope of various embodiments.

In some embodiments, a circuit comprises an inverter, a first transistor, a second transistor, and at least one switching circuit. The inverter has a first node and a second node. The first transistor has a first terminal, a second terminal, and a third terminal. The second transistor has a fourth terminal, a fifth terminal, and a sixth terminal. The at least one switching circuit is configured to switch a connection of at least one of the first transistor and the second transistor to the inverter. The second terminal and the fifth terminal are coupled to the first node. The third terminal and the sixth terminal are coupled to the second node. The first transistor and the second transistor are configured to cause a plurality of time delays at the second node.

In some embodiments, a circuit comprises an inverter, a first transistor, and a second transistor. The inverter has a first node, an input node, and an output node. The first transistor has a first terminal, a second terminal, and a third terminal. The second transistor has a fourth terminal, a fifth terminal, and an sixth terminal. The first terminal is configured to receive a first voltage. The second terminal is coupled to the first node. The third terminal is coupled to the output node. The fourth terminal is coupled to the output node. The fifth terminal is configured to receive a voltage. The sixth terminal is coupled to the input node.

In some embodiments, a total time delay for an output signal of an inverter is determined. A size of a first transistor and of a second transistor is determined to achieve the total time delay for the output signal. A first size of the first transistor causes a first time delay to the output signal. A second size of the second transistor causes a second time delay to the output signal. The total time delay is based on the first time delay and the second time delay. At least one of the first transistor and the second transistor is switched from and to a first node of the inverter. The first transistor has a first terminal, a second terminal, and a third terminal. The second transistor has a fourth terminal, a fifth terminal, and a sixth terminal. The second terminal and the fourth terminal are coupled to the first node. The third terminal and the sixth terminal are coupled to a second node of the inverter.

In some embodiments, a total time change for an output signal of an inverter is determined. A size of a first transistor and of a second transistor is determined to achieve the total time change for the output signal. A first size of the first transistor causes a first time change to the output signal. A second size of the second transistor causes a second time change to the output signal. The total time change is based on the first time change and the second time change. The inverter has a first node, an input node, and an output node. The first transistor has a first terminal, a second terminal, and a third terminal. The second transistor has a fourth terminal, a fifth terminal, and the sixth terminal. The second terminal is coupled to the first node. The third terminal is coupled to the output node. The fourth terminal is coupled to the output node. The sixth terminal is coupled to the input node. A transition of an input signal applied to the input node causes the second transistor to turn on before the input signal reaches a trip point of the inverter.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
   an inverter having a first node and a second node;
   a first transistor having a first terminal, a second terminal, and a third terminal;
   a second transistor having a fourth terminal, a fifth terminal, and an sixth terminal; and
   at least one switching circuit configured to switch a connection of at least one of the first transistor and the second transistor to the inverter,
   wherein
      the second terminal and the fifth terminal are coupled to the first node;
      the third terminal and the sixth terminal are coupled to the second node; and
      the first transistor and the second transistor are configured to cause a plurality of time delays at the second node.

2. The circuit of claim 1, wherein
   a first switch of the at least one switching circuit comprises a first switch terminal, a second switch terminal, and a third switch terminal; and
   the first switch terminal is coupled to the fourth terminal;
   the second switch terminal is configured to receive a voltage; and the third switch terminal is configured to receive a control signal.

3. The circuit of claim 2, wherein the first terminal is configured to receive a voltage.

4. The circuit of claim 1, further comprising
a third transistor having a seventh terminal, an eight terminal, and a ninth terminal, the eight terminal coupled to the first node, the ninth terminal coupled to the second node; and
a second switching circuit configured to switch a connection of the third transistor to the first node, the second switching circuit different from the at least one switching circuit.

5. The circuit of claim 4, wherein
the second switching circuit includes a first switch terminal, a second switch terminal, and a third switch terminal; and
the first switch terminal is coupled to the seventh terminal;
the second switch terminal is configured to receive a voltage; and
the third switch terminal is configured to receive a control signal.

6. The circuit of claim 1, wherein the first transistor and the second transistor are both PMOS transistors or are both NMOS transistors.

7. The circuit of claim 1, wherein the first transistor is configured to have a first size corresponding to a first time delay on the second node, and the second transistor is configured to have a second size corresponding to a second time delay on the second node.

8. The circuit of claim 1, wherein a first threshold value of the first transistor differs from a second threshold value of the second transistor.

9. A circuit comprising:
an inverter having a first node, an input node, and an output node;
a first transistor having a first terminal, a second terminal, and a third terminal; and
a second transistor having a fourth terminal, a fifth terminal, and a sixth terminal,
wherein
the first terminal is configured to receive a first voltage;
the second terminal is coupled to the first node;
the third terminal is coupled to the output node;
the fourth terminal is coupled to the output node;
the fifth terminal is configured to receive a second voltage; and
the sixth terminal is coupled to the input node.

10. The circuit of claim 9, further comprising at least one switching circuit configured to switch a connection of at least one of the first transistor and the second transistor to the inverter.

11. The circuit of claim 9, further comprising a third transistor having a seventh terminal, an eight terminal, and a ninth terminal, wherein the fifth terminal is coupled to the seventh terminal, the eight terminal is configured to receive the second voltage, and the ninth terminal is configured to receive a control signal.

12. The circuit of claim 9, wherein the second transistor is configured to be turned on before an output signal on the output node transitions from a first output logic value to a second output logic value when an input signal on the input node transitions from a first input logic value to a second input logic value.

13. The circuit of claim 9, wherein the first transistor and the second transistor are both PMOS transistors or are both NMOS transistors.

14. The circuit of claim 9, further comprising a third transistor having a seventh terminal, an eight terminal, and a ninth terminal,
wherein
the seventh terminal is coupled to the output node;
the eighth terminal is configured to receive a second voltage; and
the ninth terminal is coupled to the input node.

15. The circuit of claim 9, wherein the first transistor is configured to have a first size corresponding to a first change of an output signal at the output node, and the second transistor is configured to have a second size corresponding to a second change of the output signal at the output node.

16. A method comprising:
determining a total time delay for an output signal of an inverter; and
determining a size of a first transistor and of a second transistor to achieve the total time delay for the output signal, a first size of the first transistor causing a first time delay to the output signal, a second size of the second transistor causing a second time delay to the output signal, the total time delay based on the first time delay and the second time delay,
wherein
a connection of at least one of the first transistor and the second transistor is switched from and to a first node of the inverter;
the first transistor has a first terminal, a second terminal, and a third terminal;
the second transistor has a fourth terminal, a fifth terminal, and a sixth terminal;
the second terminal and the fourth terminal are coupled to the first node; and
the third terminal and the sixth terminal are coupled to a second node of the inverter.

17. The method of claim 16, wherein at least one of the first terminal and the fourth terminal is coupled to a first switch terminal of a switch, a second switch terminal of the switch is configured to receive a voltage, and a third switch terminal of the switch is configured to receive a control signal.

18. A method comprising:
determining a total time change for an output signal of an inverter; and
determining a size of a first transistor and of a second transistor to achieve the total time change for the output signal, a first size of the first transistor causing a first time change to the output signal, a second size of the second transistor causing a second time change to the output signal, the total time change based on the first time change and the second time change,
wherein
the inverter has a first node, an input node, and an output node;
the first transistor has a first terminal, a second terminal, and a third terminal;
the second transistor has a fourth terminal, a fifth terminal, and a sixth terminal;
the first terminal is configured to receive a first voltage;
the second terminal is coupled to the first node;
the third terminal is coupled to the output node;
the fourth terminal is coupled to the output node;
the fifth terminal is configured to receive a second voltage;
the sixth terminal is coupled to the input node; and
a transition of an input signal applied to the input node causes the second transistor to turn on before the input signal reaches a trip point of the inverter.

19. The method of claim 18, wherein at least one switching circuit is utilized to switch a connection of at least one of the first transistor and the second transistor to the inverter.

20. The method of claim 18, further comprising a switch having a first switch terminal, a second switch terminal, and a third switch terminal, wherein the fifth terminal is coupled to the first switch terminal, the second switch terminal receives a voltage, and the third switch terminal receives a control signal.

* * * * *